(12) United States Patent
Nakamura

(10) Patent No.: US 6,333,566 B1
(45) Date of Patent: Dec. 25, 2001

(54) SEMICONDUCTOR HAVING HIGH DENSITY PACKAGING THEREOF

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/435,486

(22) Filed: Nov. 8, 1999

(30) Foreign Application Priority Data

Mar. 26, 1999 (JP) .................................................. 11-084040

(51) Int. Cl.⁷ .......................... H01L 23/12; H01L 21/02; H01L 23/34; H01L 23/02; H05K 1/18

(52) U.S. Cl. .......................... 257/790; 257/787; 257/788; 257/723; 257/686; 257/685; 257/666; 257/730; 257/774; 257/680

(58) Field of Search ...................................... 257/787, 723, 257/686, 685, 666, 730, 774, 480, 696, 693, 698, 790, 788

(56) References Cited

U.S. PATENT DOCUMENTS

| | | | |
|---|---|---|---|
| 3,536,964 | * | 10/1970 | Lob et al. . |
| 4,989,063 | * | 1/1991 | Kolesar, Jr. . |
| 4,996,582 | * | 2/1991 | Hinrichsmeyer et al. . |
| 5,138,433 | * | 8/1992 | Hiruta . |
| 5,241,456 | * | 8/1993 | Marcinkiewicz et al. ........... 257/686 |
| 5,280,192 | * | 1/1994 | Kryzaniwsky ....................... 257/723 |
| 5,384,689 | * | 1/1995 | Shen ..................................... 257/686 |
| 5,422,513 | * | 6/1995 | Marcinkiewicz et al. ........... 257/668 |
| 5,696,666 | * | 12/1997 | Miles et al. .......................... 257/684 |
| 5,723,900 | * | 3/1998 | Kojima et al. ....................... 257/666 |
| 5,723,907 | * | 3/1998 | Akram ................................. 257/723 |
| 5,739,585 | * | 4/1998 | Akram et al. ........................ 257/480 |
| 5,744,862 | * | 4/1998 | Ishii ..................................... 257/686 |
| 5,763,939 | * | 6/1998 | Yamashita ........................... 257/686 |
| 5,798,564 | * | 8/1998 | Eng et al. ............................. 257/686 |
| 5,811,879 | * | 9/1998 | Akram ................................. 257/723 |
| 5,986,339 | * | 11/1999 | Pai et al. .............................. 257/700 |
| 6,013,948 | * | 1/2000 | Akram et al. ........................ 257/686 |
| 6,122,171 | * | 9/2000 | Akram et al. ......................... 257/7.2 |
| 6,153,928 | * | 11/2000 | Cho ...................................... 257/686 |

\* cited by examiner

Primary Examiner—Alexander O. Williams
(74) Attorney, Agent, or Firm—Rabin & Berdo, P.C.

(57) ABSTRACT

A semiconductor device comprises a semiconductor IC chip provided with bond pads on its first surface, a wiring substrate provided with a through hole extending between the opposite surfaces thereof, conductive members electrically connecting the bond pads of the semiconductor IC chip to the conductive lines formed on the wiring substrate respectively, and a sealing resin coating coating the first surface of the semiconductor IC chip and the conductive members, and bonding the side surface of the semiconductor IC chip to the side surface of the through hole of the wiring substrate.

7 Claims, 7 Drawing Sheets

SEMICONDUCTOR HAVING HIGH DENSITY PACKAGING THEREOF

BACKGROUND OF THE INVENTION

1. Field of the Invention

The present invention relates to a semiconductor device and a method of fabricating the semiconductor device. More particularly, the present invention relates to a thin semiconductor device that permits high-density packaging, and a method of fabricating the semiconductor device.

2. Description of the Related Art

A conventional semiconductor device is constructed by fixing a semiconductor IC chip to a wiring substrate with an adhesive, electrically connecting bond pads of the semiconductor IC chip to bond pads formed on the wiring substrate with metal wires, and sealing the semiconductor IC chip and the metal wires in a resin for protection.

When fabricating this conventional semiconductor device, the semiconductor IC chip is fixed to the wiring substrate with the adhesive, the bond pads of the semiconductor IC chip are electrically connected to the bond pads of the wiring substrate using metal wires, and the semiconductor IC chip and the metal wires are covered with and sealed in the resin.

The conventional technique, however, has the following problems. The respective thicknesses of the semiconductor IC chip and the layer of the adhesive bonding the semiconductor IC chip to the wiring substrate are included in the thickness of the semiconductor device, which makes it difficult to form the semiconductor device in a small thickness.

The area of the layer of the adhesive is greater than that of the semiconductor IC chip, and the layer of the adhesive spreads in an unpredictable shape when compressed between the semiconductor IC chip and the wiring substrate. Therefore, the bond pads of the wiring substrate to which the bond pads of the semiconductor IC chip are to be connected by the metal wires must be spaced from the periphery of the semiconductor IC chip by, for example, 8 mm or above, which makes high-density packaging difficult.

SUMMARY OF THE INVENTION

Accordingly, it is an object of the present invention to provide a thin semiconductor device that enable high-density packaging thereof.

With the foregoing object in, the present invention provides a semiconductor device comprising a semiconductor IC chip provided on its first surface with bond pads; a wiring substrate provided with a through hole extending between its first surface and its second surfaces opposed to the first surface; conductive members electrically connecting the bond pads of the semiconductor IC chip to conductive lines formed on the wiring substrate; and a resin molding covering the surface of the semiconductor IC chip and fixing side surface of the semiconductor IC chip to side surface of the through hole.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

First Embodiment

Figure 1:
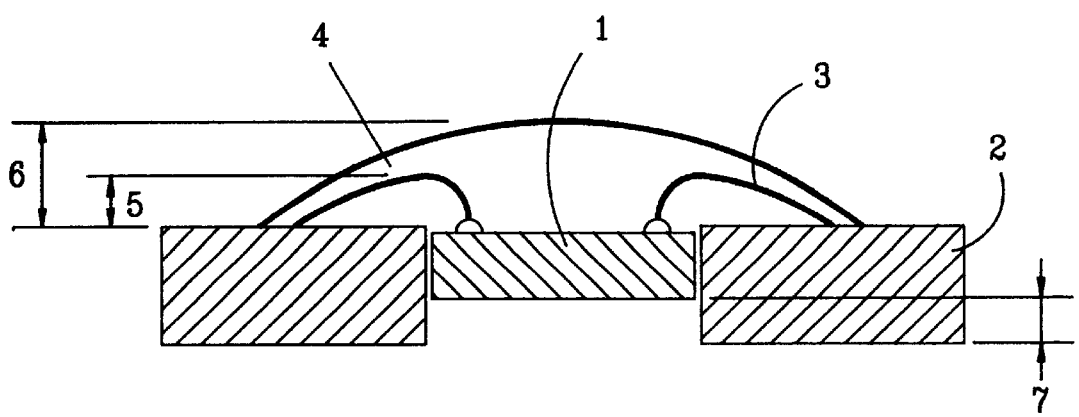
FIG. 1 is a sectional view of a semiconductor device in a first embodiment according to the present invention.

Referring to FIG. 1, a semiconductor device in a first embodiment according to the present invention comprises a semiconductor IC chip 1 provided on its front surface with bond pads, a wiring substrate 2 provided with a through hole, metal wires 3, and a sealing resin coating 4. The metal wires 3 are extended to a height 5 that is described below. The sealing resin coating 4 has a height 6 that is described. The back surface of the semiconductor IC chip 1 is spaced a distance 7 apart form the back surface of the wiring substrate 2.

Referring to FIG. 1, the semiconductor IC chip 1 is inserted in the through hole of the wiring substrate 2, and the bond pads of the semiconductor IC chip 1 are electrically connected to the bond pads formed at the edge of the conductive lines of the wiring substrate 2 using the metal wires 3. The sealing resin coatina molding 4 coats the semiconductor IC chip 1 and the metal wires 3. Part of the sealing resin coating 4 fills up gaps between the side surface of the semiconductor IC chip 1 and the side surface of the through hole of the wiring substrate 2 to bond the semiconductor IC chip 1 to the wiring substrate 2.

The height 5 of the metal wires 3 is in the range of 150 to 250 µm, and hence the thickness 6 of the sealing resin coating 6 is in the range of 170 to 270 µm. The maximum thickness 6 is 270 µm. The sealing resin coating 4 may possibly flow through the gaps between the side surface of the semiconductor IC chip 1 and the side surface of the through hole of the wiring substrate 2 onto the back surface of the semiconductor IC chip 1. Therefore, the back surface of the semiconductor IC chip 1 is separated from the back surface of the wiring substrate 2 by a distance 7 of 50 µm or more. If the sealing resin coating 4 that flowed onto the back surface of the semiconductor IC chip 1 is removed later, the back surface of the semiconductor IC chip 1 may be flush with the back surface of the wiring substrate 2, i.e., the distance 7 may be naught.

Since the semiconductor IC chip 1 is inserted in the through hole of the wiring substrate 2, the thickness 6 of the sealing resin coating 4 is dependent substantially only on the height 5 of the metal wires 3 and is less than that of the sealing resin coating of the corresponding conventional semiconductor device.

Thus, the semiconductor device of the present invention can be formed having a small thickness.

Since the semiconductor IC chip 1 is inserted in the through hole of the wiring substrate 2, the length of the metal wires 3 is shorter than that of corresponding conventional semiconductor and hence the total resistance of the metal wires 3 can decreased.

Since the semiconductor IC chip 1 is inserted in the through hole of the wiring substrate 2, the semiconductor IC chip 1 can be attached to the wiring substrate 2 with its front surface substantially flush with the front surface of the wiring substrate 2 and hence the faulty coating of the semiconductor IC chip 1 and the metal wires 3 with the sealing resin coating attributable to steps between the semiconductor IC chip 1 and the wiring substrate 2 will rarely occur. Since no adhesive is used for attaching the semiconductor IC chip 1 to the wiring substrate 2, the bond pads of the wiring substrate 2 need not be separated far from the edges of the semiconductor IC chip 1 to avoid being covered with an irregularly spread layer of an adhesive. The distance between the edges of the semiconductor IC chip 1 and the bond pads of the wiring substrate 2 may be about 0.3 mm. Accordingly, the sealing resin coating 4 can be formed in a small area, which enables high-density packaging.

Since the semiconductor IC chip 1 is attached to the wiring substrate 2 without using any adhesive, there is no occurrence of separation of the sealing resin coating 4 and the wiring substrate 2 from each other by the shrinkage of an adhesive, when used, bonding the semiconductor IC chip 1 to the wiring substrate 2 caused by a heat shock exerted on the adhesive or the disconnection of the metal wires 3 from the bond pads of the wiring substrate 2.

A tape provided with conductive wires, or wires of a conductive paste may be used instead of the metal wires 3 to connect the bond pads of the semiconductor IC chip 1 to the bond pads of the wiring substrate 2. Generally, such a tape has a thickness in the range of 60 to 200 $\mu$m and hence the thickness 6 of the sealing resin coating 4 may be in the range of about 80 to 200 $\mu$m, which enables the fabrication of a semiconductor device having a further reduced thickness. Wires of a conductive paste are formed in a thickness in the range of 60 to 200 $\mu$m and hence the thickness 6 of the sealing resin coating 4 may be in the range of abut 50 to 220 $\mu$m, which also enables the fabrication of a semiconductor device having a further reduced thickness. Wires of a conductive paste do not come off the wiring substrate 2 easily because of their large area in contact with the wiring substrate 2.

A method of fabricating the semiconductor device in the first embodiment will be described hereinafter with reference to FIGS. 2(a) to 2(e), in which 8 is an adhesive tape and 9 is a stage provided with a projection, and parts like or corresponding to those shown in FIG. 1 are designated by the same reference characters.

Figure 2A:
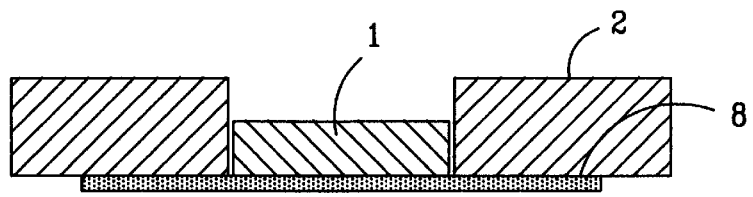
FIGS. 2(a) to 2(e) are typical sectional views of assistance in explaining a method of fabricating the semiconductor device in the first embodiment.

As shown in FIG. 2(a), adhesive tape 8 provided with an adhesive layer is attached to the second surface of the wiring substrate 2, and the semiconductor IC chip 1 is inserted in the through hole of the wiring substrate 2 so as to be attached to the adhesive tape 8.

Figure 2B:
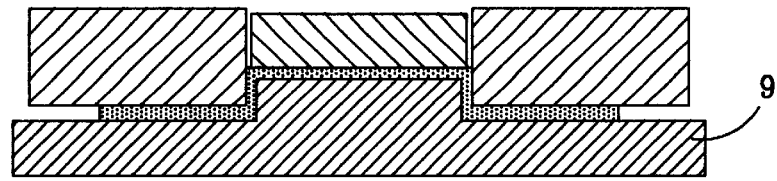

As shown in FIG. 2(b), the wiring substrate 2 is placed on stage 9 provided with a projection so that the projection of the stage 9 is fitted in the through hole of the wiring substrate 2 to push up the semiconductor IC chip 1 relative to the wiring substrate 2. Since the semiconductor IC chip 1 and the stage 9 have dimensional errors, the front surface of the semiconductor IC chip 1 extends at a height from the front surface of the wiring substrate 2 in the range of 150 $\mu$m.

Figure 2C:
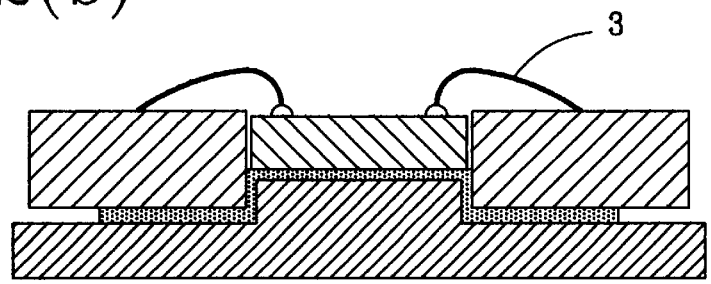

As shown in FIG. 2(c), the bond pads of the semiconductor IC chip 1 are connected to the bond pads formed at the edge of the wiring substrate 2 by the metal wires 3, respectively.

Figure 2D:
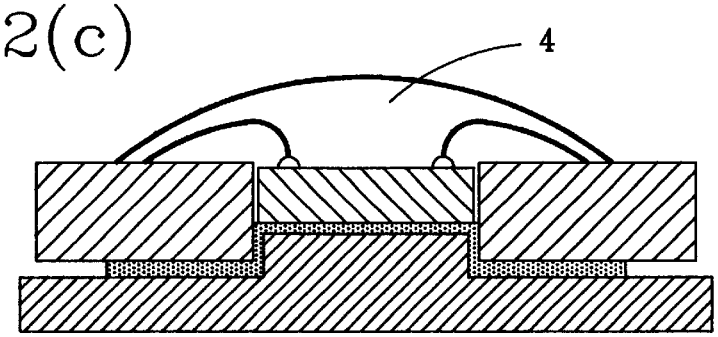

As shown in FIG. 2(d), the semiconductor IC chip 1 and the metal wires 3 are coated with the sealing resin coating 4. Part of the sealing resin coating 4 fills up gaps between the side surface of the semiconductor IC chip 1 and the side surface of the through hole of the wiring substrate 2.

Figure 2E:
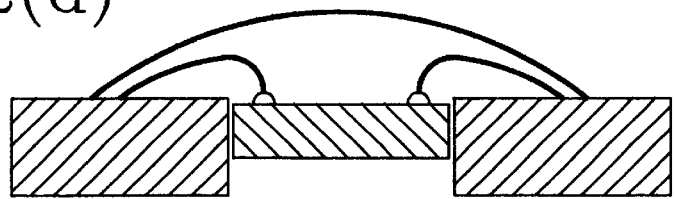

Finally, as shown in FIG. 2(e), the semiconductor device formed by thus assembling the semiconductor IC chip 1, the wiring substrate 2, the metal wires 3 and the sealing resin coating 4 is separated from the adhesive tape 8 and the stage 9.

Another method of fabricating the semiconductor device in the first embodiment is illustrated by FIGS. 3(a) to 3(d), in which 10 indicates a stage having a projection provided with an air passage.

Figure 3A:
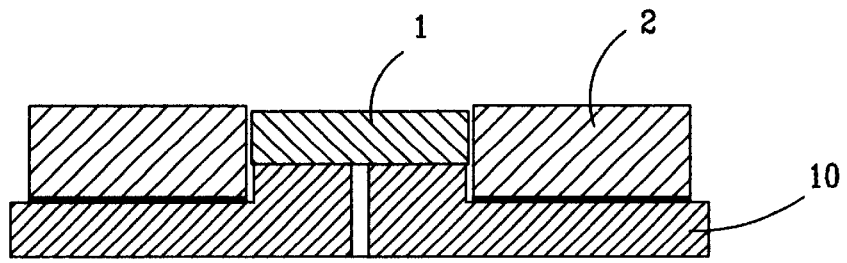
FIGS. 3(a) to 3(d) are typical sectional views of assistance in explaining another method of fabricating the semiconductor device in the first embodiment.

As shown in FIG. 3(a), the projection of the stage 10 is inserted in the through hole of the wiring substrate 2, and the semiconductor IC chip 1 is inserted in the through hole of the wiring substrate 2 and is seated on the projection of the stage 10. Since the semiconductor IC chip 1 and the stage 10 have dimensional errors, the front surface of the semiconductor IC chip 1 extends at a height from the front surface of the wiring board 2 in the range of 150 $\mu$m.

Figure 3B:
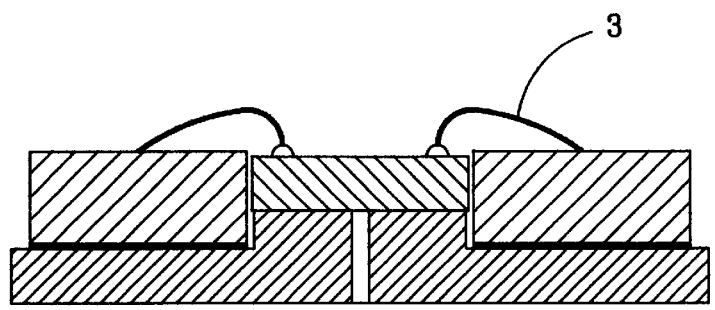

As shown in FIG. 3(b), the bond pads of the semiconductor IC chip 1 are connected to the bond pads of the wiring substrate 2 by the metal wires 3, respectively, by a wire bonding process. During the wire bonding process, suction is exerted on the semiconductor IC chip 1 through the air passage to hold the semiconductor IC chip 1 fixedly in place on the stage 10.

Figure 3C:
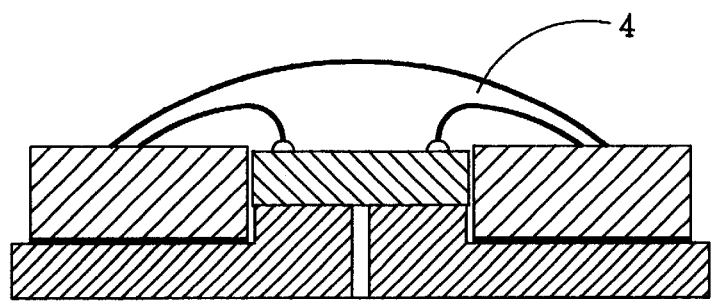

As shown in FIG. 3(c), the semiconductor IC chip 1 and the metal wires 3 are coated with the sealing resin coating 4. Part of the sealing resin coating 4 fills up gaps between the side surface of the semiconductor IC chip 1 and the side surface of the through hole of the wiring substrate 2.

Figure 3D:
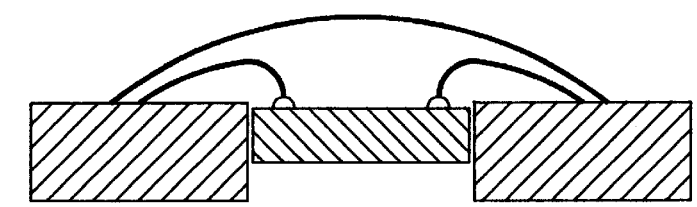

Finally, as shown in FIG. 3(d), the semiconductor device formed by thus assembling the semiconductor IC chip 1, the wiring substrate 2, the metal wires 3 and the sealing resin coating 4 is separated from the stage 10.

The foregoing methods of fabricating the semiconductor device in the first embodiment connect the bond pads of the semiconductor IC chip 1 to those of the wiring substrate 2 by the metal wires 3. Those methods may use tape provided with conductive wires or wires of a conductive paste instead of the metal wires 3.

Figure 4:
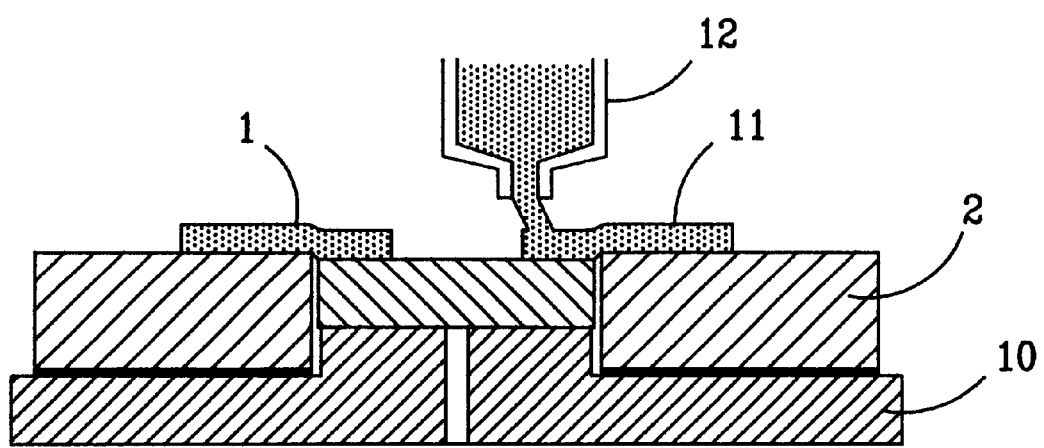
FIG. 4 is a typical sectional view of assistance in explaining a method of forming wires by using a conductive paste.

A method of forming wires of a conductive paste will be described hereinafter with reference to FIG. 4, in which 11 indicates a wire of a conductive paste and 12 indicates a nozzle, and parts like or corresponding to those shown in FIGS. 3(a) to 3(d) are designated by the same reference characters. As shown in FIG. 4, the conductive paste is applied to the first surfaces of the semiconductor IC chip 1 and the wiring substrate 2 by the nozzle 12 so as to form wires 11 interconnecting the bond pads of the semiconductor IC chip 1 and the wiring substrate 2.

Figure 5A:
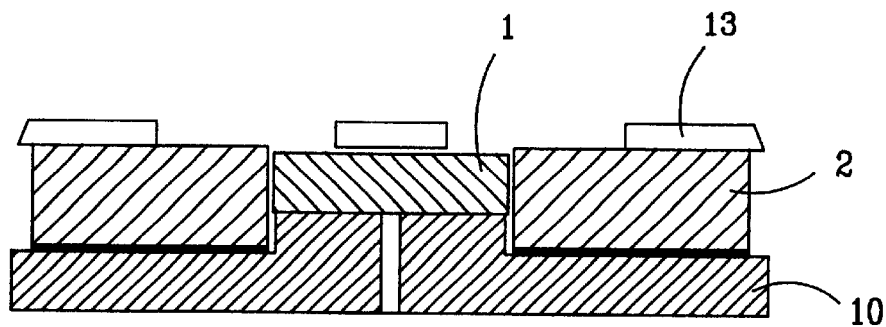
FIGS. 5(a) to 5(c) are typical sectional views of assistance in explaining a method of forming wires by using a conductive paste.
Figure 5B:
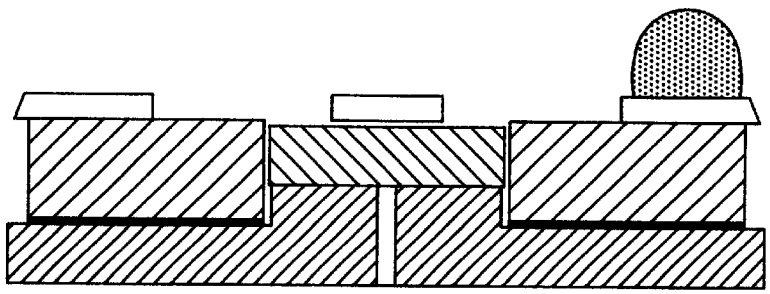
Figure 5C:
Figure 5C:
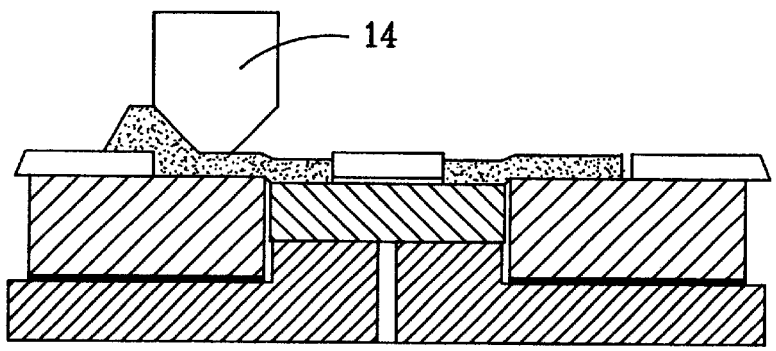

FIGS. 5(a) to 5(c) illustrate another method of forming wires of a conductive paste, in which 13 indicates a mask having a pattern of open areas corresponding to a pattern of wires and indicates 14 a squeegee, and parts like or corresponding to those shown in FIG. 4 are designated by the same reference characters.

As shown in FIG. 5(a), the mask 13 is disposed on the wiring substrate 2 so that the open areas of the mask 13 correspond to regions in which wires are formed on the semiconductor IC chip 1 and the wiring substrate 2, respectively.

Subsequently, as shown in FIG. 5(b), a mass of a conductive paste is put on the mask 13.

Finally, as shown in FIG. 5(c), the squeegee 14 is moved along the surface of the mask 13 in the direction of the arrow to spread the conductive paste into the open areas of the mask 13 to form the wires 11. The wires 11 can be formed in a substantially uniform thickness depending on the thickness of the mask 13. The wires 11 can be formed in a desired thickness by selectively determining the thickness of the mask 13.

FIGS. 6(a) to 6(d) illustrate a third method of forming the wires 11 of a conductive paste, in which 15 indicates a transfer roller and 16 indicates a letterpress printing plate, and parts like or corresponding to those shown in FIG. 4 are designated by the same reference characters.

Figure 6A:
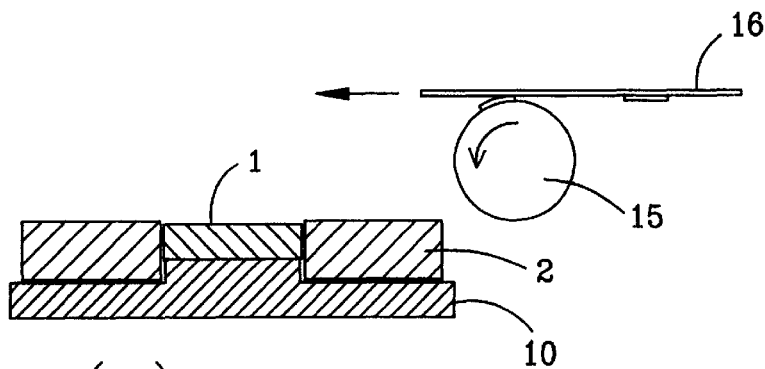
FIGS. 6(a) to 6(d) are typical sectional views of assistance in explaining a method of forming wires by using a conductive paste.

As shown in FIG. 6(a), the transfer roller 15 is rotated in the direction of the arrow, and the letter press printing plate 16 having surface areas coated with a pattern of a conductive paste corresponding to a pattern of wires 11 is moved in the direction of the arrow at a speed equal to the circumferential speed of the transfer roller 15 to transfer a pattern of the conductive paste corresponding to the pattern of wires 11 to be formed on the semiconductor IC chip 1 and the wiring substrate 2 from the letterpress printing plate 16 to the transfer roller 15.

Figure 6B:
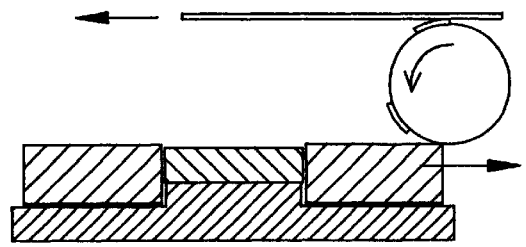

As shown in FIG. 6(b), a stage 10 supporting the wiring substrate 2 and the semiconductor IC chip 1 inserted in the through hole of the wiring substrate 2 presses the wiring substrate 2 against the circumference of the transfer roller 15 and is moved in the direction of the arrow opposite the moving direction of the letterpress printing plate 16 at a speed equal to the circumferential speed of the transfer roller 15.

Figure 6C:
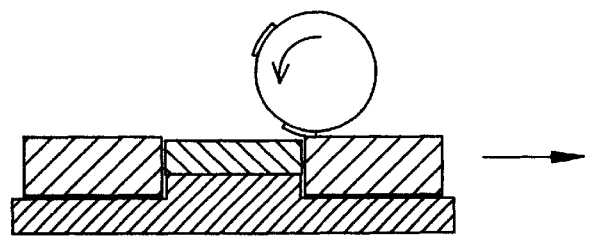
Figure 6D:
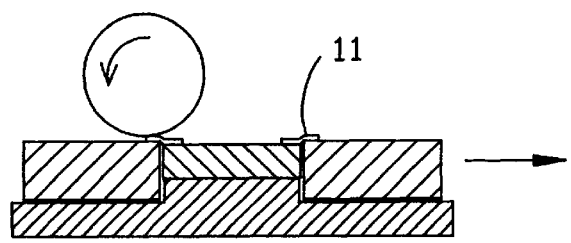

Consequently, the pattern of the conductive paste is transferred from the transfer roller 15 to the semiconductor IC chip 1 and the wiring substrate 2 as shown in FIG. 6(c) and the wires 11 of the conductive paste are formed on the front surfaces of the semiconductor IC chip 1 and the wiring substrate 2 as shown in FIG. 6(d).

Second Embodiment

Figure 7:
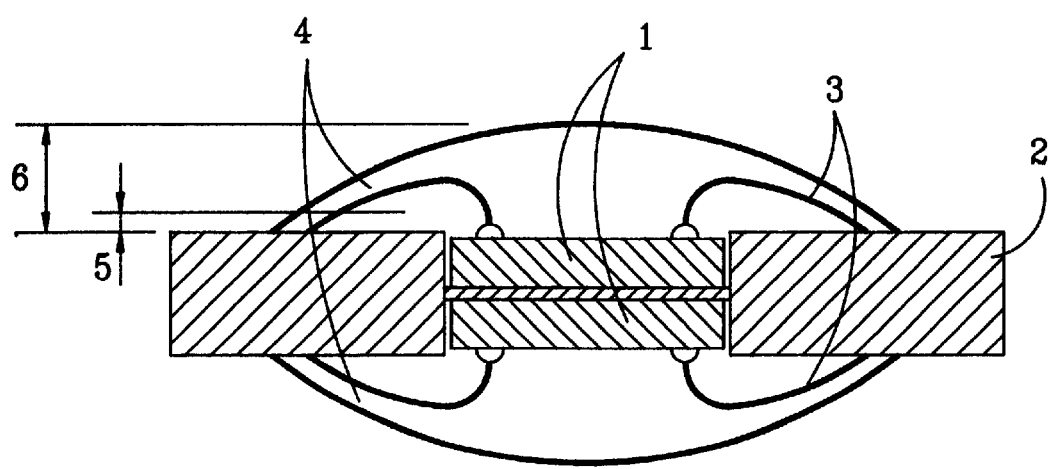
FIG. 7 is a typical sectional view of a semiconductor device in a second embodiment according to the present invention.

A semiconductor device in a second embodiment according to the present invention is shown in FIG. 7, in which parts like or corresponding to those of the first embodiment are designated by the same reference characters.

The semiconductor device in the second embodiment has a wiring substrate 2 provided with a through hole extending between the opposite surfaces thereof, and two semiconductor IC chips 1 each provided with bond pads on one surface thereof and inserted in the through hole of the wiring substrate 2 in a back-to-back arrangement with the surfaces not provided with the bond pads facing each other. The bond pads of the semiconductor IC chips 1 are electrically connected to the bond pads formed at the edge of the conductive lines of the wiring substrate 2 using metal wires 3. Sealing resin coatings 4 seal the semiconductor IC chips 1 and the metal wires 3 therein and bond together the semiconductor IC chips 1 and the wiring substrate 2. The sealing resin coatings 4 fill up gaps between the side surface of the semiconductor IC chips 1 and the side surface of the through hole of the wiring substrate 2.

The metal wires 3 extend to a height in the range of 150 to 250 $\mu$m, and each of the sealing resin coatings 4 has a height 6 in the range of about 170 to 270 $\mu$m. The maximum thickness 6 is 270 $\mu$m.

The bond pads of the semiconductor IC chips 1, similar to those of the semiconductor device in the first embodiment, may similar be connected to the bond pads of the wiring substrate 2 by a tape provided with conductive wires or by wires of a conductive paste. When wires of a conductive paste are employed, the same may be formed by the method of forming the wires of the conductive paste previously described in connection with the first embodiment.

The semiconductor device in the second embodiment, similar to that in the first embodiment, is fabricated by inserting one of the semiconductor IC chips 1 in the through hole of the wiring substrate 2, electrically connecting the bond pads of the semiconductor IC chip 1 to bond pads formed on one of the opposite surfaces of the wiring substrate 2 using the metal wires 3, coating the semiconductor IC chip 1 and the metal wires 3 with the sealing resin coating 4, inverting the wiring substrate 2 upside down, inserting the other semiconductor IC chip 1 in the through hole of the wiring substrate 2, electrically connecting the bond pads of the semiconductor IC chip 1 to bond pads formed on the other surface of the wiring substrate 2 by the metal wires 3, and coating the semiconductor IC chip 1 and the metal wires 3 with the sealing resin coating 4.

The semiconductor device in the second embodiment, similar to that in the first embodiment, can be formed in a small thickness and permit high-density packaging. Further since two semiconductor IC chips are inserted in the through hole of the wiring substrate, the semiconductor device in the second embodiment has multi-function.

The semiconductor device in the present invention can be formed with a small thickness because the semiconductor IC chips are inserted in the through hole of the wiring substrate. Since no adhesive is used for attaching the semiconductor IC chips to the wiring substrate, the bond pads of the wiring substrate need not be separated far from the edges of the semiconductor IC chips to avoid being covered with an irregularly spread layer of an adhesive. The bond pads of the wiring substrate may be formed at positions close to the edges of the semiconductor IC chips. Accordingly, the semiconductor device can be formed in a small area, which enables high-density packaging.

The foregoing embodiments of the present invention are illustrative and not restrictive. It is obvious to those skilled in the art that various changes and modifications are possible in the foregoing embodiments without departing from the scope and spirit of the invention. The scope of the invention, therefore, is to be determined solely by the following claims.

What is claimed is:

1. A semiconductor device, comprising:
 a wiring substrate having a first surface and a second surface opposed to the first surface, said wiring substrate having a plurality of conductive lines formed on the first and second surfaces and a through hole extending between the first and second surfaces thereof;
 a first semiconductor IC chip having a first surface, a second surface opposed to the first surface and a plurality of side surfaces extending between the first and second surfaces, said first IC chip including a plurality of first bond pads formed on the first surface thereof, said first IC chip being disposed in the through hole of said wiring substrate so that the first surface of said wiring substrate is substantially level to the first surface of said first IC chip;
 a second semiconductor IC chip having a first surface, a second surface opposed to the first surface and a plurality of side surface extending between the first and second surfaces, said second IC chip including a plurality of second bond pads formed on the first surface thereof, said second IC chip being disposed in the through hole of said wiring substrate so that the second surface of said second IC chip is fixed to the second surface of said first IC chip, and a level of the second surface of said wiring substrate is level to the first surface of said second IC chip;

a plurality of first conductive wires that connect the bond pads of said first IC chip and the conductive lines formed on the first surface of said wiring substrate, respectively;

a plurality of second conductive wires that connect the bond pads of said second IC chip and the conductive lines formed on the second surface of said wiring substrate, respectively;

first sealing resin that coats said first conductive wires, the first and side surfaces of said first IC chip and a part of the first surface and the through hole of said wiring substrate; and a second sealing resin that coats said second conductive wires, the first and side surfaces of said second IC chip and a part of the second surface and the through hole of said wiring substrate, wherein said first and second sealing resins are a substantial sole member for physically connecting said first and second IC chip and said wiring substrate.

2. A semiconductor device, comprising:

a wiring substrate having a first surface and a second surface opposed to the first surface, said wiring substrate having a plurality of conductive lines formed on the first and second surfaces and a through hole extending between the first and second surfaces thereof;

a first semiconductor IC chip having a first surface, a second surface opposed to the first surface and a plurality of side surfaces extending between the first and second surfaces, said first IC chip including a plurality of first bond pads formed on the first surface thereof, said first IC chip being disposed in the through hole of said wiring substrate so that the first surface of said wiring substrate is substantially level to the first surface of said first IC chip;

a second semiconductor IC chip having a first surface, a second surface opposed to the first surface and a plurality of side surface extending between the first and second surfaces, said second IC chip including a plurality of second bond pads formed on the first surface thereof, said second IC chip being disposed in the through hole of said wiring substrate so that the second surface of said second IC chip is fixed to the second surface of said first IC chip, and a level of the second surface of said wiring substrate is level to the first surface of said second IC chip;

a plurality of first conductive wires that connect the bond pads of said first IC chip and the conductive lines formed on the first surface of said wiring substrate, respectively;

a plurality of second conductive wires that connect the bond pads of said second IC chip and the conductive lines formed on the second surface of said wiring substrate, respectively;

a first sealing resin that coats said first conductive wires, the first and side surfaces of said first IC chip and a part of the first surface and the through hole of said wiring substrate; and a second sealing resin that coats said second conductive wires, the first and side surfaces of said second IC chip and a part of the second surface and the through hole of said wiring substrate, wherein said first and second sealing resins are a substantial sole member for physically connecting said first and second IC chip and said wiring substrate, wherein the through hole of said wiring substrate has a side wall that is perpendicular to the first surface of said wiring substrate.

3. A semiconductor device, comprising:

a wiring substrate having a first surface and a second surface opposed to the first surface, said wiring substrate having a plurality of conductive lines formed on the first and second surfaces and a through hole extending between the first and second surfaces thereof;

a first semiconductor IC chip having a first surface, a second surface opposed to the first surface and a plurality of side surfaces extending between the first and second surfaces, said first IC chip including a plurality of first bond pads formed on the first surface thereof, said first IC chip being disposed in the through hole of said wiring substrate so that the first surface of said wiring substrate is substantially level to the first surface of said first IC chip;

a second semiconductor IC chip having a first surface, a second surface opposed to the first surface and a plurality of side surface extending between the first and second surfaces, said second IC chip including a plurality of second bond pads formed on the first surface thereof, said second IC chip being disposed in the through hole of said wiring substrate so that the second surface of said second IC chip is fixed to the second surface of said first IC chip, and a level of the second surface of said wiring substrate is level to the first surface of said second IC chip;

a plurality of first conductive wires that connect the bond pads of said first IC chip and the conductive lines formed on the first surface of said wiring substrate, respectively;

a plurality of second conductive wires that connect the bond pads of said second IC chip and the conductive lines formed on the second surface of said wiring substrate, respectively;

a first sealing resin that coats said first conductive wires, the first and side surfaces of said first IC chip and a part of the first surface and the through hole of said wiring substrate; and a second sealing resin that coats said second conductive wires, the first and side surfaces of said second IC chip and a part of the second surface and the through hole of said wiring substrate, wherein said first and second sealing resins are a substantial sole member for physically connecting said first and second IC chip and said wiring substrate, wherein a height of said first conductive wires is 150 to 250 $\mu$m.

4. A semiconductor device according to claim 3, wherein a thickness of said first sealing resin is 170 to 270 $\mu$m.

5. A semiconductor device, comprising:

a wiring substrate having a first surface and a second surface opposed to the first surface, said wiring substrate having a plurality of conductive lines formed on the first and second surfaces and a through hole extending between the first and second surfaces thereof;

a first semiconductor IC chip having a first surface, a second surface opposed to the first surface and a plurality of side surfaces extending between the first and second surfaces, said first IC chip including a plurality of first bond pads formed on the first surface thereof, said first IC chip being disposed in the through hole of said wiring substrate so that the first surface of said wiring substrate is substantially level to the first surface of said first IC chip;

a second semiconductor IC chip having a first surface, a second surface opposed to the first surface and a plurality of side surface extending between the first and second surfaces, said second IC chip including a plurality of second bond pads formed on the first surface thereof, said second IC chip being disposed in the through hole of said wiring substrate so that the second surface of said second IC chip is fixed to the second surface of said first IC chip, and a level of the second surface of said wiring substrate is level to the first surface of said second IC chip;

a plurality of first conductive wires that connect the bond pads of said first IC chip and the conductive lines formed on the first surface of said wiring substrate, respectively;

a plurality of second conductive wires that connect the bond pads of said second IC chip and the conductive lines formed on the second surface of said wiring substrate, respectively;

a first sealing resin that coats said first conductive wires, the first and side surfaces of said first IC chip and a part of the first surface and the through hole of said wiring substrate; and a second sealing resin that coats said second conductive wires, the first and side surfaces of said second IC chip and a part of the second surface and the through hole of said wiring substrate, wherein said first and second sealing resins are a substantial sole member for physically connecting said first and second IC chip and said wiring substrate, wherein a height of said second conductive wires is 150 to 250 $\mu$m.

6. A semiconductor device according to claim 4, wherein a thickness of said second sealing resin is 170 to 270 $\mu$m.

7. A semiconductor device, comprising:

wiring substrate having a first surface and a second opposed to the firsts surface, said wiring substrate having a plurality of conductive lines formed on the first and second surfaces and a through hole extending between the first and second surfaces thereof;

a first semiconductor IC chip having a first surface, a second surface opposed to the first surface and a plurality of side surfaces extending between the first and second surfaces, said first IC chip including a plurality of first bond pads formed on the first surface thereof, said first IC chip being disposed in the through hole of said wiring substrate so that the first surface of said wiring substrate is substantially level to the first surface of said first IC chip;

a second semiconductor IC chip having a first surface, a second surface opposed to the first surface and a plurality of side surface extending between the first and second surfaces, said second IC chip including a plurality of second bond pads formed on the first surface thereof, said second IC chip being disposed in the through hole of said wiring substrate so that the second surface of said second IC chip is fixed to the second surface of said first IC chip, and a level of the second surface of said wiring substrate is level to the first surface of said second IC chip;

a plurality of first conductive wires that connect the bond pads of said first IC chip and the conductive lines formed on the first surface of said wiring substrate, respectively;

a plurality of second conductive wires that connect the bond pads of said second IC chip and the conductive lines formed on the second surface of said wiring substrate, respectively;

a first sealing resin that coats said first conductive wires, the first and side surfaces of said first IC chip and a part of the first surface and the through hole of said wiring substrate; and a second sealing resin that coats said second conductive wires, the first and side surfaces of said second IC chip and a part of the second surface and the through hole of said wiring substrate, wherein said first and second sealing resins are a substantial sole member for physically connecting said first and second IC chip and said wiring substrate, wherein a maximum thickness of said sealing resins is 270 $\mu$m.

* * * * *